United States Patent [19]

Ljung

[11] 4,160,184

[45] Jul. 3, 1979

[54] PIEZOELECTRIC ACTUATOR FOR A RING LASER

[75] Inventor: Bo H. G. Ljung, Wayne, N.J.

[73] Assignee: The Singer Company, Little Falls, N.J.

[21] Appl. No.: 868,067

[22] Filed: Jan. 9, 1978

[51] Int. Cl.² .......................................... H01L 41/10
[52] U.S. Cl. ................................. 310/328; 310/331; 310/359; 310/369; 356/350
[58] Field of Search ............... 310/328, 330, 331, 332, 310/359, 369; 356/106 LR

[56] References Cited

U.S. PATENT DOCUMENTS

| 2,943,279 | 6/1960 | Mattiat | 310/359 X |
| 3,374,367 | 3/1968 | Cowan | 310/359 |
| 3,501,099 | 3/1970 | Benson | 310/328 X |
| 3,524,196 | 8/1970 | Church et al. | 310/328 |
| 4,011,474 | 3/1977 | O'Neill | 310/328 |

Primary Examiner—Mark O. Budd
Attorney, Agent, or Firm—T. W. Kennedy

[57] ABSTRACT

A piezoelectric actuator for use in controlling the path length in a ring laser is made up of a plurality of piezoelectric discs which have a different polarity in their central area than at their circumference so as to result in exerting a pushpull effect on the mirror which they control permitting fewer discs to be used, a lighter structure and a structure which is stiffer and has a more rectilinear motion without deleterious rotation.

14 Claims, 9 Drawing Figures

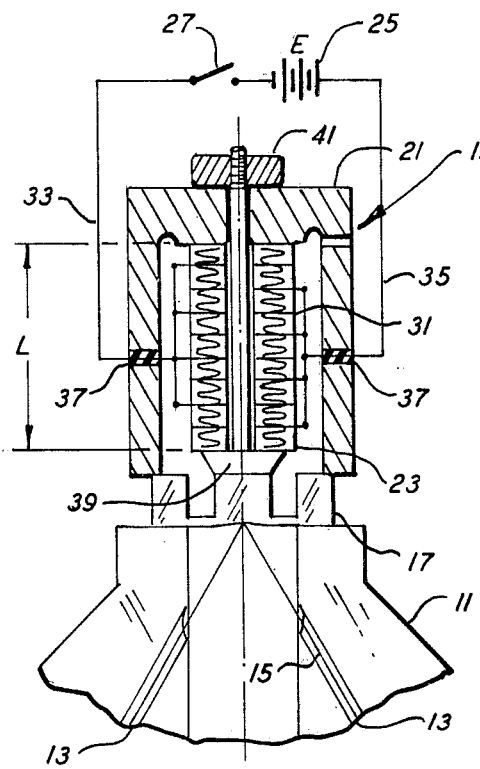
*FIG. 1*
*Prior Art*
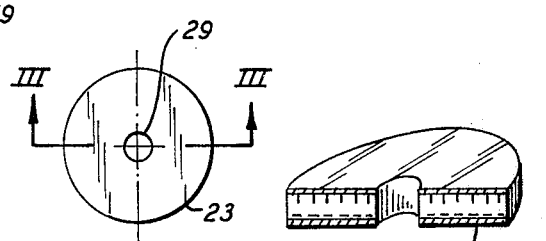
*FIG. 2*
*Prior Art*
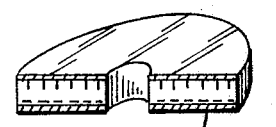
*FIG. 3*
*Prior Art*
*FIG. 4*
*Prior Art*
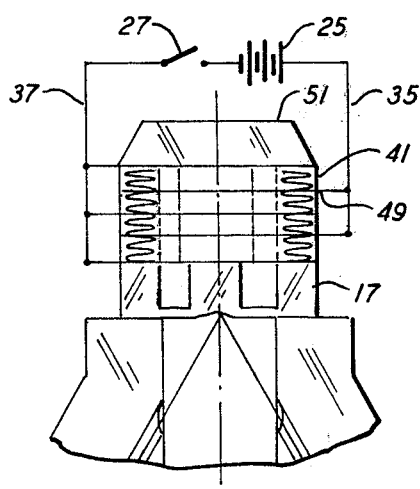
*FIG. 5*
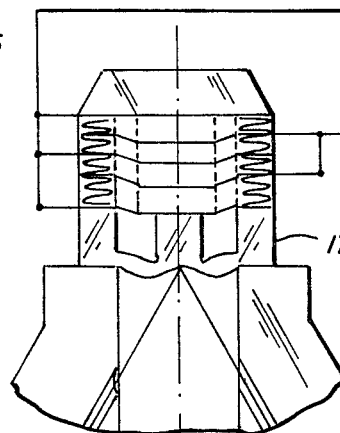
*FIG. 6*
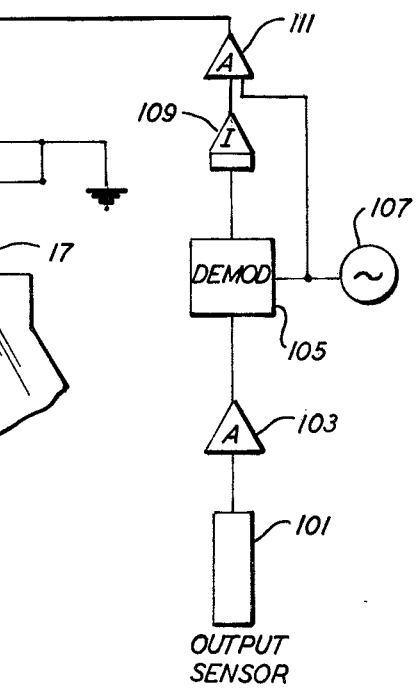

PIEZOELECTRIC ACTUATOR FOR A RING LASER

BACKGROUND OF THE INVENTION

This invention relates to ring laser gyroscopes in general and more particularly to an improved piezoelectric actuator for a ring laser gyro.

A ring laser gyro, as its name implies, is a gyroscope which utilizes a laser beam directed to travel in a closed path, e.g., a ring, to detect rotation about the axis of the path around which the laser beam is directed. Typical ring laser gyroscopes are disclosed in U.S. Pat. Nos. 3,373,650 and 3,467,472. The ring laser gyroscope must be capable of operating over a wide range of temperatures. As a result, the material of which the gyroscope is made suffers thermal expansion and contraction as the temperature changes. The laser beam within the ring laser gyroscope is directed in its path by means of mirrors, typically in a triangular path between three mirrors. The temperature change resulting in expansion or contraction, causes a change in the path length. This change in path length, if not corrected, can result in a drift, i.e., an output indicating a rotation when there actually is none, and also results in scale factor changes. Thus, it is common practice to make one mirror with a flexible annulus and mount this mirror on a piezoelectric actuator which is controlled such as to maintain the path length constant even though temperature changes makes the material expand or contract.

One type of actuator is disclosed in U.S. Pat. No. 3,581,227. In the device disclosed therein, the casing for the stack of piezoelectric discs comprises an extension of the mirror structure with a cover thereover.

Typically, these piezoelectric actuators are designed to control the path length of the laser to an integral number of laser wave lengths. It is usually desired that an actuator at least have the ability to change the flexible mirror five free spectral ranges, e.g., to change the ring laser gyroscope from one resonance to a fifth higher or lower resonance. For operation with visible red helium-neon laser wave-lengths, this means the mirror must be able to move at least $$\Delta L = (5 \times 0.6328 \times 10^{-6})/\sqrt{3} \text{ meters.}$$

The typical prior art arrangement for accomplishing this is illustrated in FIG. 1. The ring laser casing 11 is typically made up of a material such as Cervit. It contains channels 13 through which the laser beam 15 is directed. In order that the laser beam travel in a closed path, mirrors 17 are provided for reflecting the laser beam. One mirror 17 is made with a flexible annular area to permit changes in the path length. In order to control this path length, an actuator indicated generally as 19, has been commonly used. The actuator includes a housing 21 made of a metal such as Invar so as to match the thermal expansion coefficient of the gyroscope casing 11. Disposed within the casing 19 are a plurality of piezoelectric discs 23 shown in plan view on FIG. 2 and in cross sectional perspective view on FIG. 3. Piezoelectric discs are well known in the art and are such as to change their thickness in response to a voltage. Although the voltage is typically provided by an amplifier for purposes of simplicity, the discs are shown on FIG. 1 as being energized from a battery 25 through a switch 27. Modern piezoelectric materials are capable of changing their thickness $\Delta L/L = 200 \times 10^{-6}$ at full applied voltage. Thus, using the equation given above, the length of the piezoelectric stack must be $L = 0.0091$ meter or 0.36 inches. As illustrated, the discs commonly in use have a hole 29 through their center. The piezoelectric material is normally divided into a plurality of discs typically 0.02 inch thick in order to permit the practical use of transistorized amplifiers where voltages typically are chosen not to exceed ±400V. The terminals are attached by means of thin spacers of metal 31, one of which is shown in perspective view on FIG. 4. The piezoelectric discs have the polarity indicated on FIG. 3 and are placed back-to-back, i.e., the positive of side of one disc to the positive side of the adjoining disc, with a spacer 31 therebetween, in order that, when energized, all discs expand and contract together. The common positive and negative leads 33 and 35 are brought out of the housing 21 through feed-throughs 37. The discs 23 and spacers 31 are held together by means of a nut 39 and bolt 41. The head of the bolt 39 being attached by appropriate adhesive to the mirror 3.

The primary disadvantage of this prior art actuator is its complexity. Many parts and electrical connections are required. Furthermore, the stack of discs 23 does not have great stiffness due to its rather small diameter dictated by space constraints and its relatively large height L. Stiffness is important because the alignment stability required of the mirrors is such that tilt cannot exceed 1 arc sec, anything more causing a noticeable effect. Furthermore, because a metal such as Invar is used as the housing material, the weight is increased and furthermore, the thermal expansion of the housing and that of the stack of discs will not cancel each other. This is a problem because it causes additional thermal expansion problems and makes it more difficult to maintain a constant path length.

A further disadvantage of a device such as that shown on FIG. 1 is that these devices are quite difficult to control with respect to arc-over. In order to prevent arc-over, the actuator must be treated with a conformal coating. It is almost impossible to assure complete coating on the inside of a closed cramped space such as in the housing 21. Thus, there is always a risk that a small spot might be missed and arc-over will occur, particularly at low ambient pressures.

In some instances, there have also been attempts to use bimorphs in actuators. A bimorph acts similar to a bimetal but is made up of piezoelectric material with radially expanding discs. Typically, one expanding disc and one contracting disc is used. The main drawback of such an arrangement is extremely low stiffness. If used in ring laser gyros, the membrane of the flexible mirror such as the mirror 17, must be made thinner than otherwise. Normally, the mirror membrane is cut to 0.04 inch. Great thinness greatly increases the price and also increases the risk of leaks.

Thus, it becomes evident that there is a need for a simpler actuator which provides greater stiffness to maintain better alignment stability.

SUMMARY OF THE INVENTION

The present invention provides such an improved actuator for use in ring laser gyroscopes. To accomplish this, it employs piezoelectric discs which exhibit a different polarity in their central region than in their circumferential region, there being a gap therebetween. Thus, when energized, the discs exhibit a differential expansion and contraction between their outside and inside in order to get a push-pull effect. Consequently, the same amount of expansion and contraction can be accomplished with fewer discs. Furthermore, a casing is no longer necessary in this arrangement. The inner and outer portions of the discs being held together with a coupling member at one end, the mirror being attached to the other end. With the elimination of the casing, fewer and more accessible electrical connections makes assembly simpler.

In accordance with the preferred embodiment, the discs contain annular cutouts between the central region and circumferential regions of different polarity to improve flexibility. Furthermore, as illustrated, it is possible to simply cement the discs together using an epoxy or the like. Alternatively, a nut and bolt connection may be used in combination with cementing.

BRIEF DESCRIPTION OF THE DRAWINGS

FIG. 1 is a cross sectional view of an actuator commonly used in the prior art.

FIG. 2 is a plan view of a piezoelectric disc such as that used in FIG. 1.

FIG. 3 is a cross sectional perspective view through the disc of FIG. 2.

FIG. 4 is a perspective view of a conductor spacer disc used in the embodiment of FIG. 1.

FIG. 5 is a cross sectional view of an actuator according to the present invention in a non-excited condition.

FIG. 6 is a similar view of the actuator with a voltage applied to carry out a push-pull expansion-contraction.

DETAILED DESCRIPTION OF THE INVENTION

Figure 7:
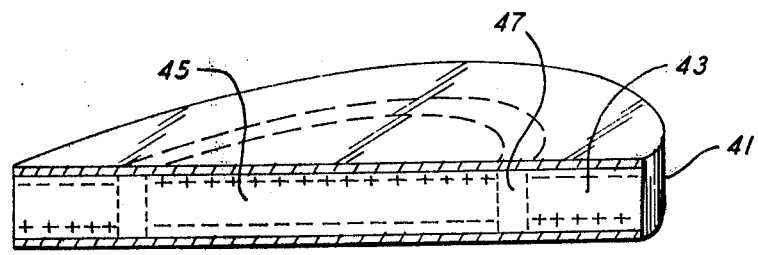
FIG. 7 is a cross sectional perspective view through a first type of disc useable in the embodiments of FIGS. 5 and 6.

FIGS. 5 and 6 illustrate in cross sectional view the actuator of the present invention in the unactuated and actuated conditions, respectively. As with prior art actuators, it utilizes a plurality of piezoelectric discs 41. However, as is shown by the cross sectional view of FIG. 7, the discs 41 differ from those of the prior art in that they have an outer circumferential section 43 exhibiting a first polarity and a central portion 45 exhibiting the opposite polarity. An area 47 in between is free from expansion and contraction effects in response to voltage. The plan view of FIG. 8 shows the relative arrangement of the three areas 43, 45 and 47. As in the previous prior art embodiment, a spacer 49 is disposed between each two discs. Once again, the discs 41 are placed back-to-back so that the same polarity is present on both sides of the disc. As illustrated by FIG. 5, the spacer 49 contains a tab 51 with a hole 53 therein for making an electrical connection. The excitation by means of a battery 25 and switch 27 is the same in FIG. 5 as in the prior art embodiment. However, FIG. 6 shows the actual implementation.

The output sensor 101 of the ring laser gyroscope is amplified in an amplifier 103 and provided into a demodulator 105. The demodulator obtains a reference from a signal generator 107 operating at approximately 2 kHz, with an amplitude chosen to vary the path length about 1% of the free spectral range. The demodulator output is integrated in an integrator 109 and further amplified in a high voltage amplifier 111, the output of which drives the piezoelectric discs. The output of the generator 107 is an additional input to amplifier 111 so as to impress this frequency on the signal therefrom, thereby causing a slight oscillation of the mirror 17 during operation to permit automatic adjustment to achieve peak of the frequency characteristic. Thus, this signal will be detected by the output sensor 101 requiring the demodulator 105 for detection thereof.

In the embodiment of FIGS. 5 and 6, the discs are attached to the appropriate spacers by means of a cement such as a conductive epoxy. Attached to the top of the stack is a coupling member 51. Coupling member 51 may be of glass, ceramic or a glass ceramic. Particularly useful are glass ceramics which exhibit zero expansion. Alternatively, a titania stabilized quartz glass which exhibits low expansion is also useable. The former types of material, i.e., ceramic glasses with zero expansion are available from Owen-Cornings under the trade name Cervit and from the Shott Company of Germany under the name Zerodur. The titania stabilized quartz glass is available under the trade name ULE from Corning. The coupling member 51 is, of course, also cemented to the discs as is the mirror 17.

Application of a voltage to the stack is illustrated by FIG. 6. Because of the different polarities in the circumferential area 43 and the central area 45, a push-pull effect takes place with the circumferential area contracting and the central area expanding. As a result, the overall expansion or movement of the mirror 17 is doubled over that which would be accomplished with the same number of discs in the prior art. Consequently, only half as many discs of the same thickness are required. Furthermore, with this arrangement, a casing is unnecessary and the attachment of the electrical leads 35 and 37 to the spacers 49, is greatly simplified. In addition, the weight is greatly reduced since the Invar casing is no longer necessary.

Figure 8:
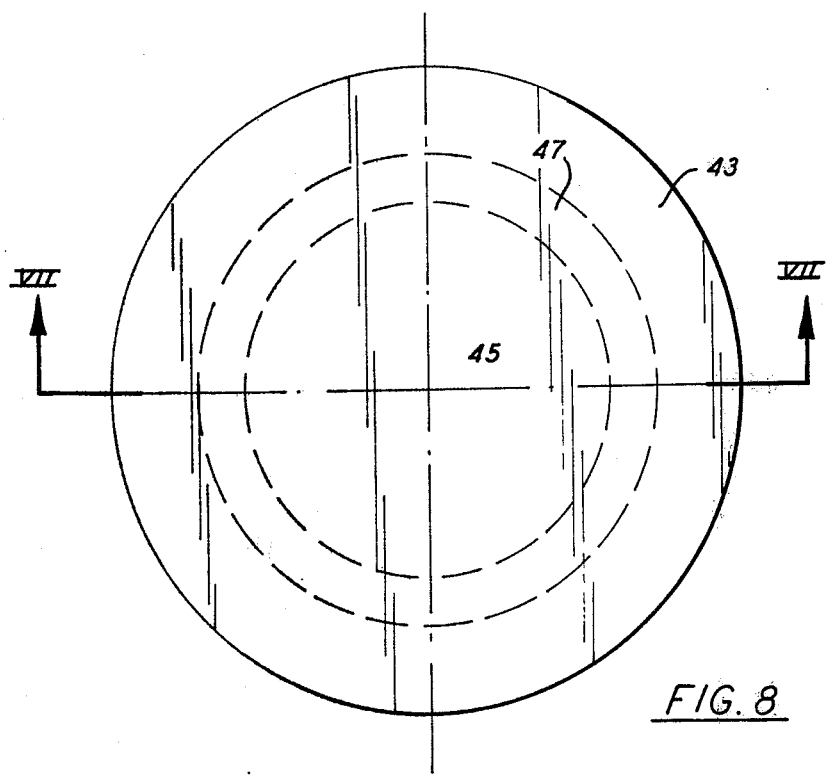
FIG. 8 is a plan view of the disc of FIG. 7.
Figure 9:
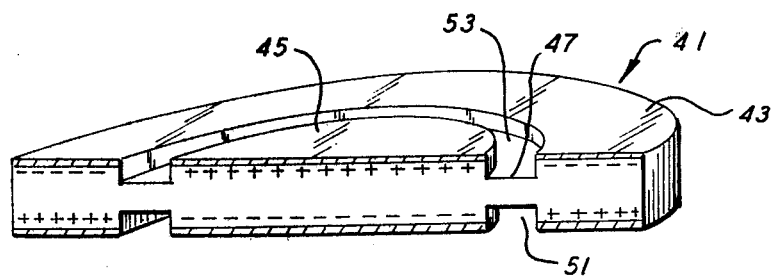
FIG. 9 is a perspective cross sectional view of an alternate disc useable in the embodiments of FIGS. 5 and 6.

FIG. 9 shows a piezoelectric disc 41a which is preferred over the disc 41 of FIG. 7. The disc of FIG. 9 is essentially the same as that of FIG. 7, except that it contains annular cutouts 51 and 53 in its bottom and/or top respectively. This increases the flexibility in the area 47 separating the inner region and circumferential region 43. Discs can be obtained, for example, from Vernitron.

Although the actuator has been disclosed as particularly useful in ring laser gyroscopes, it is, of course, universally applicable anywhere where a actuator of this nature is required.

I claim:

1. An improved piezoelectric actuator for controlling path length in a ring laser gyroscope comprising:
   (a) a plurality of piezoelectric discs, arranged in a stack, each of said piezoelectric discs having a central region exhibiting a first polarity and a circumferential area exhibiting an opposite polarity behavior with an area in each of said discs between said inner area and circumferential area exhibiting no polarity behavior, and having annular cutouts in said area exhibiting no polarity behavior in the top and/or bottom of each disc in order to increase flexibility, said discs arranged so that the areas of the same polarity lie adjacent each other on adjacent discs;
   (b) a rigid coupling member at one end of said stack of discs;

(c) a flexible mirror having a central portion, a circumferential portion and a flexible annular area between said central portion and circumferential portion, at the other end of said stack;

(d) means for holding said coupling member discs and flexible mirror together such that said coupling member is rigidly attached to both the central region and circumferential area of the disc at said one end, the circumferential areas of adjacent discs are attached to each other, the central areas of adjacent discs are attached to each other, the central portion of said mirror is attached to the central region of the disc at the other end and the circumferential portion of said mirror is attached to the circumferential area of the disc at said other end; and (e) means for coupling a voltage to the faces of said discs.

2. An actuator according to claim 1 wherein said means for coupling a voltage comprise conductive spacers lying next to each disc surface in said stack.

3. An actuator according to claim 2 wherein said means holding said discs together comprise means holding said discs, spacers and coupling member together.

4. An actuator according to claim 3 wherein said means holding comprise conductive epoxy cement.

5. An actuator according to claim 3 wherein said means holding comprise a nut and bolt passing through said discs, spacers and coupling member.

6. An actuator according to claim 5 and further including a flexible mirror having an outer annular region, and inner cylindrical region and a membrance connection said two regions, and an annular spacer, said spacer having one side attached to the other end of said stack in the outer circumferential area and to the outer annular region of said mirror, the inner cylindrical region of said mirror attached to the head of said bolt.

7. An actuator according to claim 6 wherein said spacer is made of a material which exhibits essentially zero expansion.

8. An actuator according to claim 5 and further including conductive cement holding said discs, spacers and coupling member together.

9. An actuator according to claim 1 wherein said coupling member has a chamfer on its outside circumference to reduce weight without impairing stiffness.

10. An actuator according to claim 9 and further including a flexible mirror having an outer annular region, and inner cylindrical region and a membrane connecting said two regions, said outer annular region connected to the circumferential area at the other end of said stack of discs and said inner cylindrical area connected to the central area of said other end of said stack of discs.

11. An actuator according to claim 1 wherein said coupling member is selected from the group consisting of glass, glass ceramic and ceramic.

12. An actuator according to claim 11 wherein said coupling member is made of a material of essentially zero thermal expansion.

13. An actuator according to claim 12 wherein said coupling member is made of a glass ceramic material.

14. Actuator according to claim 12 wherein said coupling member is made of a titanium stabilized quartz glass of extremely low thermal expansion.

* * * * *